(12) United States Patent
Lin et al.

(10) Patent No.: US 6,333,261 B1
(45) Date of Patent: Dec. 25, 2001

(54) METHOD FOR PREVENTING ALUMINUM INTRUSIONS

(75) Inventors: Chi-Jung Lin, Chang Hua Hsien; Jyh-J Huang; Horng-Bor Lu, both of Hsin Chu; Kun-Lin Wu, Hsin Chu Hsien, all of (TW)

(73) Assignee: United Microelectronics Corp., Hsin-Chu (TW)

( * ) Notice: Subject to any disclaimer, the term of this patent is extended or adjusted under 35 U.S.C. 154(b) by 36 days.

(21) Appl. No.: 09/584,697

(22) Filed: Jun. 1, 2000

(51) Int. Cl.[7] .................................................. H01L 21/44
(52) U.S. Cl. .......................... 438/656; 438/637; 438/653; 257/761
(58) Field of Search ..................... 438/636, 637, 438/653, 654, 656; 257/761

(56) References Cited

U.S. PATENT DOCUMENTS

| 5,780,356 | * | 7/1998 | Kim ...................................... 438/656 |
| 5,833,817 | * | 11/1998 | Tsai et al. .............................. 438/656 |
| 5,911,857 | * | 6/1999 | Kim ...................................... 438/656 |
| 6,043,148 | * | 3/2000 | Peng et al. ............................. 438/656 |
| 6,107,190 | * | 8/2000 | Taguwa et al. ........................ 438/637 |
| 6,121,132 | * | 9/2000 | Lin et al. ............................... 438/656 |
| 6,265,305 | * | 7/2001 | Tsou et al. ............................. 438/656 |
| 6,277,729 | * | 8/2001 | Wu et al. ............................... 438/656 |

FOREIGN PATENT DOCUMENTS

| 70445553 | * | 7/1993 | (JP) ............................. H01L/21/203 |
| 10022390 | * | 1/1998 | (JP) ............................. H01L/21/768 |
| 414811 | * | 12/2000 | (TW) ................................ C23C/16/00 |

* cited by examiner

*Primary Examiner*—Charles Bowers
*Assistant Examiner*—David S Blum
(74) *Attorney, Agent, or Firm*—Winston Hsu

(57) ABSTRACT

A semiconductor wafer includes a substrate, an aluminum layer on the substrate, an anti-reflection coating on the aluminum layer, a dielectric layer on the anti-reflection coating, and a via hole that passes through the dielectric layer and the anti-reflection coating down to a predetermined depth within the aluminum layer. A titanium layer is formed on the bottom and on the walls of the via hole. A physical vapor deposition process is then performed to form a first titanium nitride layer on the titanium layer. A chemical vapor deposition process is then performed to form a second titanium nitride layer on the first titanium nitride layer.

12 Claims, 3 Drawing Sheets

METHOD FOR PREVENTING ALUMINUM INTRUSIONS

BACKGROUND OF THE INVENTION

1. Field of the Invention

The present invention relates to a method for preventing aluminum intrusions into a via hole on a semiconductor wafer.

2. Description of the Prior Art

With the increasing complexity of integrated circuits, the surface of the semiconductor wafer cannot provide enough area to form circuit interconnects. In order to form interconnects on this decreasing MOS transistor scale, a multi-level interconnect process is the typical method used in an integrated circuit. In the multilevel interconnects process, a plug is used to electrically connect two conductive layers. Transistors on the wafer connect to each other via the plug so as to form an entire circuit.

Aluminum is usually used as the conductive material in a metallization process because of its good conductive properties, and because it is easy to deposit using a sputtering process. In a typical method for forming a plug, an etching process is performed to form a via hole in a dielectric layer, and a chemical vapor deposition (CVD) process is used to fill tungsten into the via hole so as to form the plug.

Please refer to FIG. 1 to FIG. 3. FIG. 1 to FIG. 3 are schematic diagrams of the prior art method for forming a via plug 30. As shown in FIG. 1, a prior art semiconductor wafer 10 includes a substrate 12, an aluminum layer 14 on the substrate 12, an anti-reflection coating (ARC) 16 on the aluminum layer 14, a dielectric layer 18 on the ARC 16, and a via hole 20 that passes through the dielectric layer 18 and the ARC 16 down to a predetermined depth within the aluminum layer 14. In the prior art method, a thin film deposition process is performed on the semiconductor wafer 10 using a physical vapor deposition (PVD) method. Either a collimator sputtering process, or an ionized metal process, can be used to form a titanium layer 22 on the bottom and on the walls of the via hole 20. Because titanium is good at oxygen gettering, and an ohmic contact at the interface between titanium and silicon can be approached easily at a proper temperature, titanium is usually used in a contact process. However, the titanium layer 22 is limited by the poor step coverage properties of the sputtering process, so the titanium layer 22 that covers the fringe portions of the bottom of the via hole 20 is very thin.

As shown in FIG. 2, the semiconductor wafer 10 is then placed into a chamber that is pre-heated to 400° C. to 450° C. (752° F. to 842° F.). However, aluminum 14 melts and intrudes into the via hole 20 due to the high temperatures of the CVD process. As shown in FIG. 3, a CVD process then forms a titanium nitride layer (TiN) 26 on the surface of the titanium layer 22 and the intrusion aluminum layer 24. The titanium layer 26 is used as a barrier layer to prevent spiking phenomenon at the aluminum/silicon interface, and it also enhances the adhesion of the tungsten. A CVD process is then performed to form a blanket tungsten layer that fills the via hole 20. A tungsten etch back process is performed using a dry etching process to remove the tungsten layer that covers the surface of the dielectric layer 18. The tungsten layer 28 remaining in the via hole 20 forms the via plug 30.

In the prior art method, the chamber is pre-heated before performing the CVD process to deposit the titanium nitride layer 22. The pre-heat temperature helps a subsequent CVD process perform more smoothly. However, the pre-heat temperature is about 400° C. to 450° C. (752° F. to 842° F.), and the melting point of aluminum is lower, about 380° C. (716° F.). Hence, the high temperature of the pre-heat process causes the aluminum to melt and intrude into the via hole 20 from the thin portions of the titanium layer 22. The aluminum layer 24 intruding into the via hole 20 reacts with the titanium layer 22 and forms aluminum titanium ($AlTi_3$) at the interface. The presence of aluminum titanium results in an increased electrical resistance of the via plug 30, up to 10Ω to 20Ω. Furthermore, it can effect the reliability of the circuit.

SUMMARY OF THE INVENTION

It is therefore a primary objective of the present invention to provide a method for preventing aluminum intrusion in a via hole on a semiconductor wafer so as to solve the above mentioned problems.

In an preferred embodiment of the present invention, the semiconductor wafer includes a substrate, an aluminum layer on the substrate, an anti-reflection coating on the aluminum layer, a dielectric layer on the anti-reflection coating, and a via hole that passes through the dielectric layer and the anti-reflection coating down to a predetermined depth within the aluminum layer. In the present invention method, a titanium layer is formed on the bottom and on the walls of the via hole using a sputtering method. A physical vapor deposition process is then performed at a temperature of about room temperature to 350° C. (662° F.) to form a first titanium nitride layer on the titanium layer. The first titanium nitride layer has a thickness of 10 to 1000 angstroms. A chemical vapor deposition process is performed to form a second titanium nitride layer on the first titanium nitride layer. A tungsten plug is then formed in the via hole.

It is an advantage of the present invention that a low temperature PVD process is performed to deposit a titanium nitride layer before forming the CVD titanium nitride layer so as to prevent aluminum from intruding into the via hole during the high temperatures of pre-heat of the CVD process.

These and other objectives of the present invention will no doubt become obvious to those of ordinary skill in the art after reading the following detailed description of the preferred embodiment, which is illustrated in the various figures and drawings.

DETAILED DESCRIPTION OF THE PREFERRED EMBODIMENT

Figure 1:
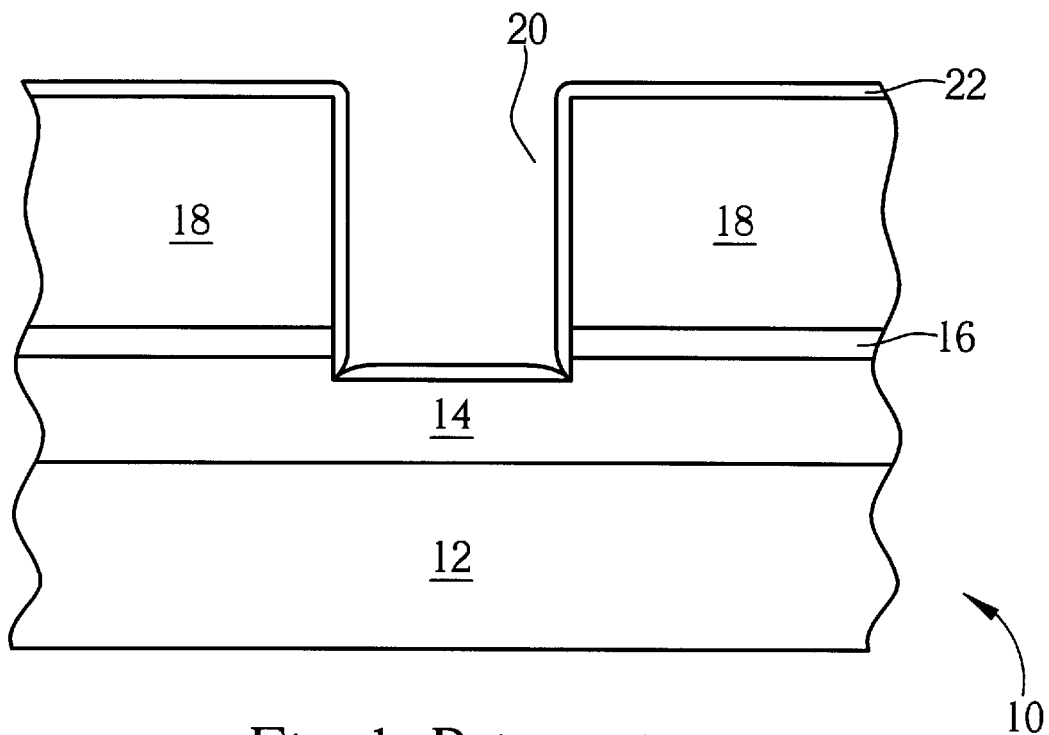
FIG. 1 to FIG. 3 are schematic diagrams of the prior art method for forming a via plug.
Figure 2:
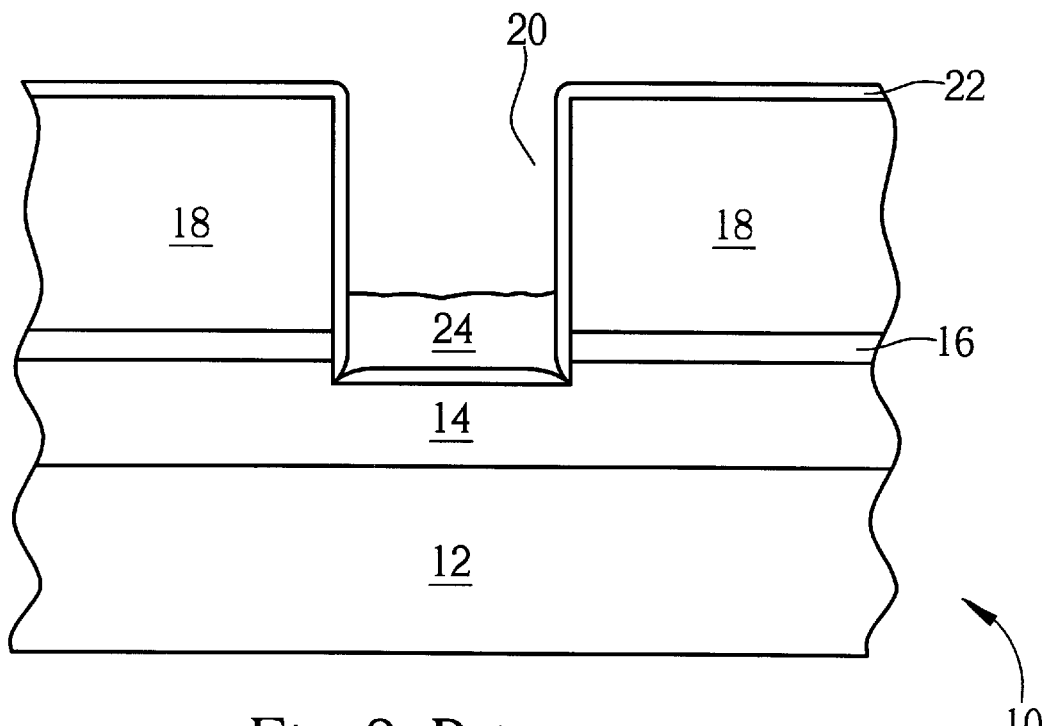
Figure 3:
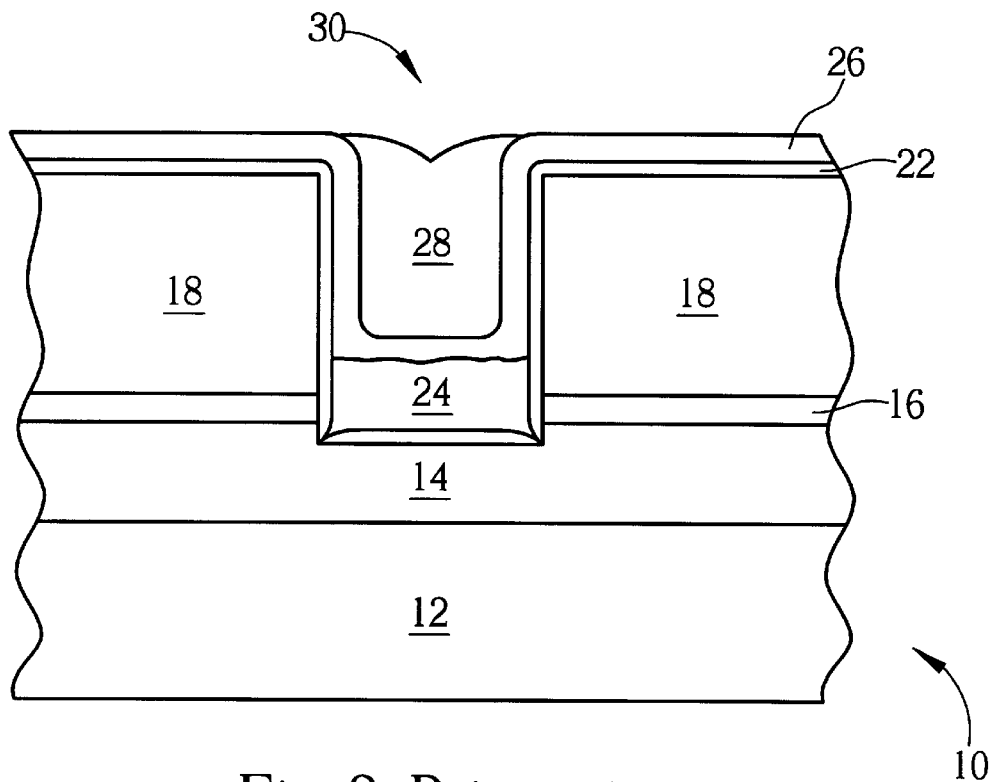
Figure 4:
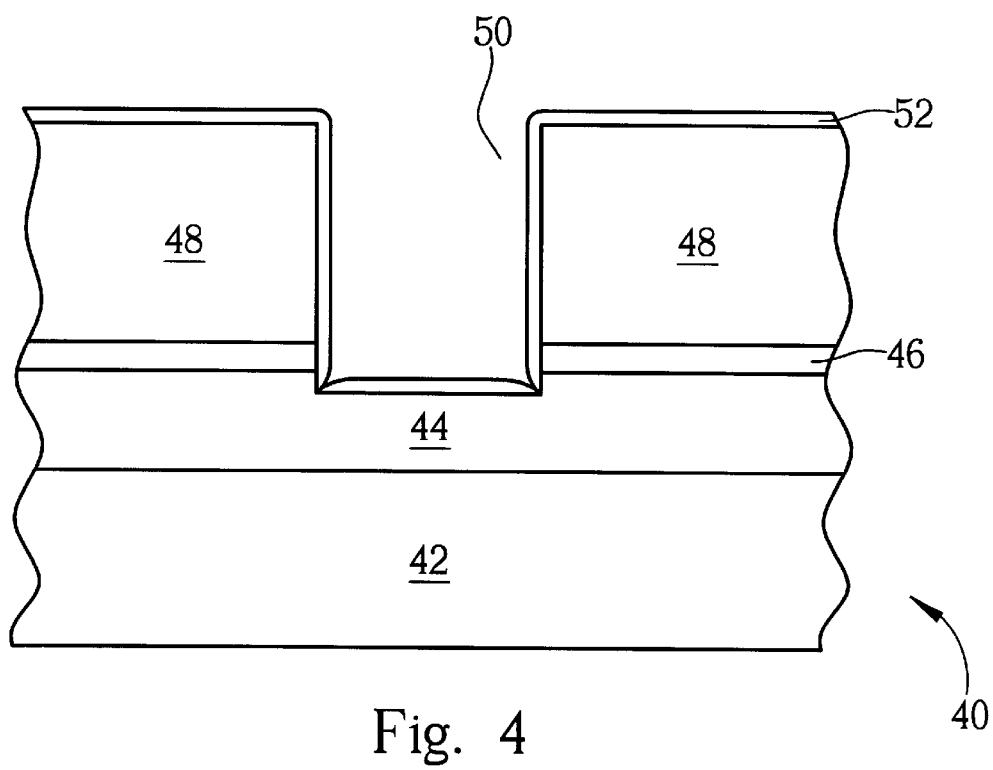
FIG. 4 to FIG. 6 are schematic diagrams of the present invention method for forming a via plug.
Figure 5:
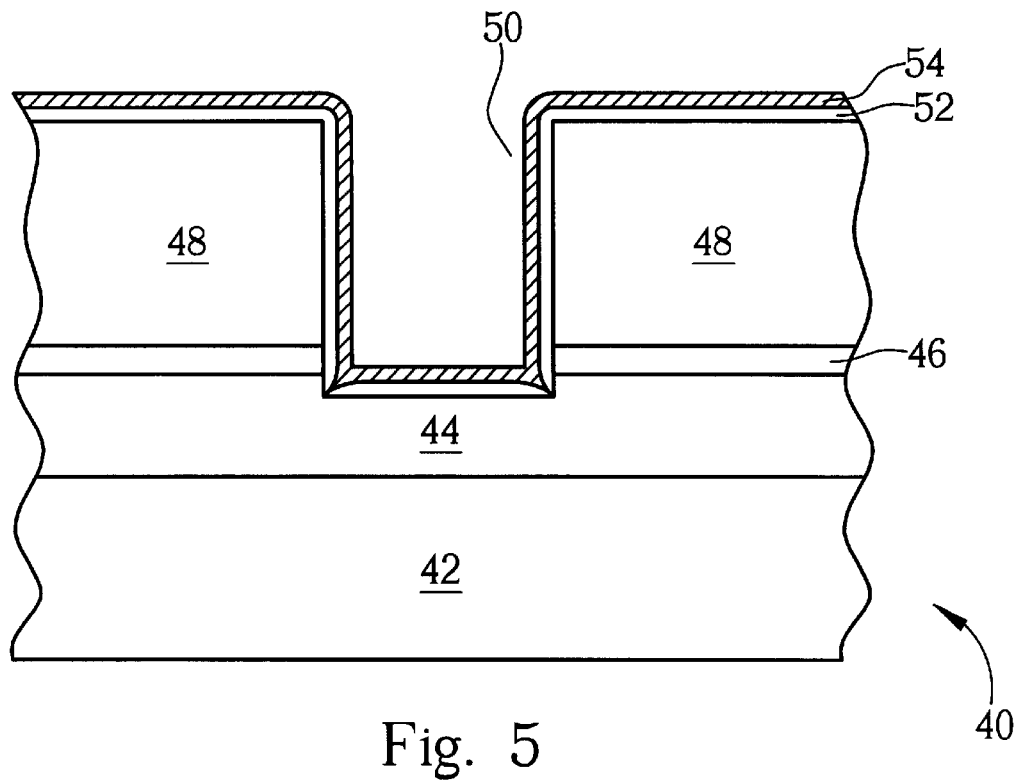
Figure 6:
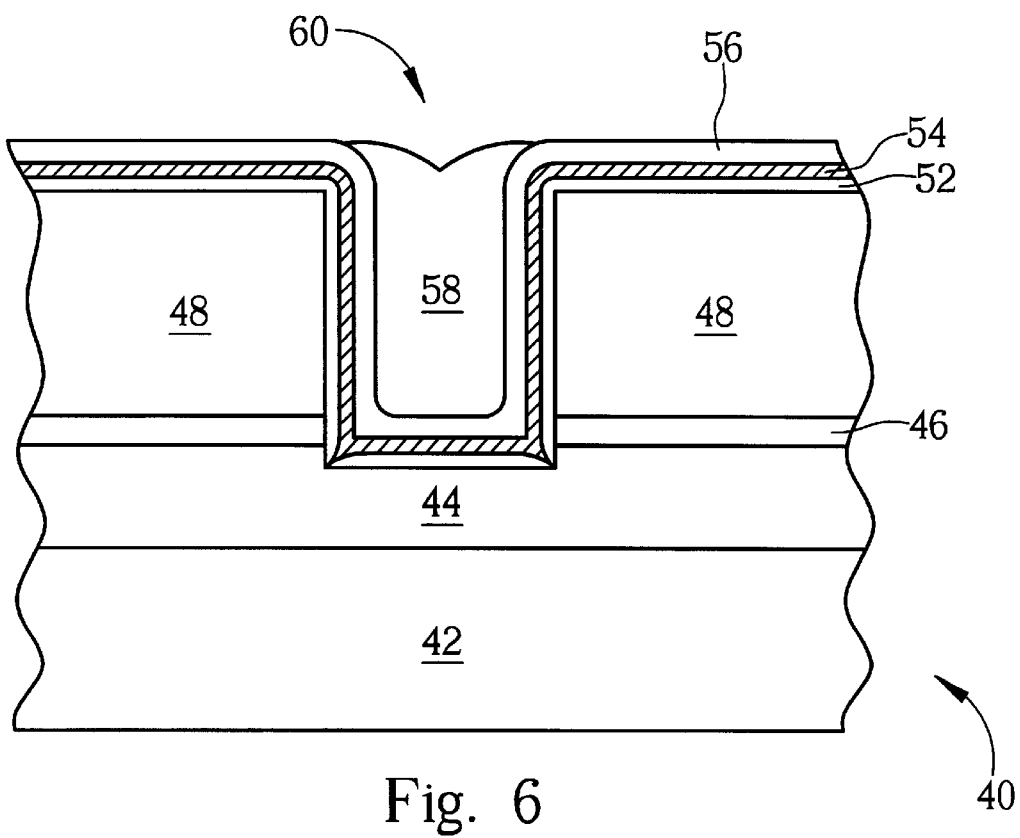

Please refer to FIG. 4 to FIG. 6. FIG. 4 to FIG. 6 are schematic diagrams of the present invention method for forming a via plug 60. As shown in FIG. 4, a semiconductor wafer 40 includes a substrate 42, an aluminum layer 44 on the substrate 42, an anti-reflection coating (ARC) 46 on the aluminum layer 44, a dielectric layer 48 on the ARC 46. The ARC 46 is typically made of titanium nitride (TiN), and is used to help pattern transfers on the surface of the aluminum layer 46. The dielectric layer 48 is typically made of silicon oxide. In the present invention method, a photoresist layer (not shown) is coated onto the surface of the dielectric layer 48, and a lithographic process is performed to define the pattern of a via hole 50 on the surface of the dielectric layer 48. A dry etching process is then performed to etch the dielectric layer 48 and the ARC 46 down to a predetermined depth within the aluminum layer 44 so as to form the via hole 50.

In recent years, Ti/TiN/AlSiCu or Ti/TiN/Wu are the typical materials used for forming the via plug in the semiconductor industry. These two types reduce work functions at the contact interface so as to avoid spiking or electromigration phenomena. The present invention also uses these materials to form the via plug.

As shown in FIG. 4, a thin film deposition process is performed on the semiconductor wafer 40 using a collimator sputtering process or an ionized metal process to form a titanium layer 52 on the bottom and on the walls of the via hole 50.

As shown in FIG. 5, a physical vapor deposition process is then performed at a temperature from about room temperature to 350° C. (662° F.) to form a titanium nitride layer 54 on the surface of the titanium layer 52. The titanium layer has a thickness of about 10 to 1000 angstroms. Titanium nitride layer 54 is used to prevent the aluminum 44 from intruding into the via hole 50 during the high temperatures of the pre-heat of the CVD process. The semiconductor wafer 40 is then placed into a chamber which has been pre-heated to 400° C. to 450° C. (752° F. to 842° F.). A CVD process is then performed to form a titanium nitride layer (TiN) 56 on the surface of the titanium layer 52.

As shown in FIG. 6, a CVD process is then performed to form a blanket tungsten layer that fills the via hole 50. A tungsten etch back process is then performed using a dry etching process, or a chemical mechanical polishing (CMP) process, to remove the tungsten layer that covers the surface of the dielectric layer 48. The tungsten layer 58 remaining in the via hole 50 forms the via plug 60.

The present invention method for forming the via plug 60 uses a low temperature PVD process to form a titanium nitride layer 52 in the via hole 50 first, and a CVD process, which involves high temperatures, is subsequently performed. The titanium nitride layer 52 formed at low temperatures is used as a barrier layer. The thickness of the titanium nitride layer 52 compensates for the thin portions of the titanium layer 52. The aluminum 44 is not melted during the low temperature deposition process, and so does not intrude into the via hole. The titanium layer 56 formed by the subsequent CVD process combines with the titanium nitride layer 54, and after tungsten 58 is filled into the via hole, the resistance of the plug is reduced to 3Ω. The present invention method prevents aluminum from intruding into the via hole. Furthermore, this method reduces the reactive area between aluminum 44 and titanium 52, which results in a reduction of aluminum titanium and a consequent reduction of resistance.

In contrast to the prior art method for forming a via plug, the present invention uses a low temperature PVD process to deposit a titanium nitride layer before forming the CVD titanium nitride layer so as to prevent aluminum from intruding into the via hole during the high temperatures of the CVD pre-heat process.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A method for preventing aluminum intrusions into a via hole on a semiconductor wafer, the semiconductor wafer comprising a substrate, an aluminum layer on the substrate, an anti-reflection coating on the aluminum layer, a dielectric layer on the anti-reflection coating, and a via hole that passes through the dielectric layer and the anti-reflection coating down to a predetermined depth within the aluminum layer, the method comprising:

forming a titanium layer on the bottom and on the walls of the via hole;

performing a physical vapor deposition process to form a first titanium nitride layer on the titanium layer; and performing a chemical vapor deposition process to form a second titanium nitride layer on the first titanium nitride layer.

2. The method of claim 1 wherein the process temperature of the physical vapor deposition process is from about room temperature to 350° C.

3. The method of claim 1 wherein the physical vapor deposition process is a collimator sputtering process, or an ionized metal process.

4. The method of claim 1 wherein the first titanium nitride layer has a thickness of 10 to 1000 angstroms.

5. The method of claim 1 wherein the pre-heat temperature of the chemical vapor deposition process is around 400 to 450° C.

6. The method of claim 4 wherein the first titanium nitride layer is used to prevent aluminum from intruding into the via hole during the high temperatures of the pre-heat of the chemical vapor deposition process.

7. A method of forming a via plug on a semiconductor wafer, the semiconductor wafer comprising a substrate, a metal layer on the substrate, an anti-reflection coating on the metal layer, a dielectric layer on the anti-reflection coating, and a via hole that passes through the dielectric layer and the anti-reflection coating down to a predetermined depth within the metal layer, the method comprising:

forming a titanium layer on the bottom and on the walls of the via hole;

performing a low temperature deposition process to form a first titanium nitride layer on the titanium layer;

performing a chemical vapor deposition process to form a second titanium nitride layer on the first titanium nitride layer; and forming the via plug in the via hole.

8. The method of claim 7 wherein the process temperature of the low temperature deposition process is from about room temperature to 350° C.

9. The method of claim 7 wherein the low temperature deposition process is a collimator sputtering process, or an ionized metal process.

10. The method of claim 7 wherein the first titanium nitride layer has a thickness of 10 to 1000 angstroms.

11. The method of claim 7 wherein the pre-heat temperature of the chemical vapor deposition process is around 400 to 450° C.

12. The method of claim 11 wherein the first titanium nitride layer is used to prevent aluminum from intruding into the via hole during the high temperatures of the pre-heat of the chemical vapor deposition process.

* * * * *